United States Patent [19]

Partus

[11] 4,276,243
[45] Jun. 30, 1981

[54] VAPOR DELIVERY CONTROL SYSTEM AND METHOD

[75] Inventor: Fred P. Partus, Cobbs County, Ga.

[73] Assignee: Western Electric Company, Inc., New York, N.Y.

[21] Appl. No.: 137,148

[22] Filed: Apr. 4, 1980

Related U.S. Application Data

[63] Continuation of Ser. No. 967,806, Dec. 8, 1978, abandoned.

[51] Int. Cl.³ .............................................. B01F 3/04
[52] U.S. Cl. ..................................... 261/128; 73/204; 137/90; 219/272; 219/273; 261/121 R; 261/131; 261/142; 261/DIG. 65
[58] Field of Search ..................... 261/121 R, 122-124, 261/128-130, 142, DIG. 65, 131; 73/204, 25, 29; 219/271-276; 128/185-188, 192-194; 137/88, 90

[56] References Cited

U.S. PATENT DOCUMENTS

| | | | |
|---|---|---|---|
| 3,178,159 | 4/1965 | Johnson | 261/128 |
| 3,323,784 | 6/1967 | Fazio | 261/130 |
| 3,528,418 | 9/1970 | Grosholz et al. | 261/DIG. 65 |
| 3,583,685 | 6/1971 | Boerger et al. | 261/128 |
| 3,650,151 | 3/1972 | Drexel | 73/29 X |
| 3,771,260 | 11/1973 | Arenson | 261/130 X |
| 3,937,063 | 2/1976 | Kethley | 73/29 |
| 3,938,384 | 2/1976 | Blair | 73/204 |
| 3,939,858 | 2/1976 | LeMay | 137/90 |
| 4,091,056 | 5/1978 | Hamalainen et al. | 261/DIG. 65 |
| 4,110,419 | 8/1978 | Miller | 261/DIG. 65 |

Primary Examiner—Richard L. Chiesa
Attorney, Agent, or Firm—Robert B. Kennedy

[57] ABSTRACT

A method is disclosed for controlling the delivery of vapor from a bubbler containing a supply of liquid through which a carrier gas is bubbled and from which bubbler vapor is delivered in a vapor stream entrained with the carrier gas. The method comprises the steps of sensing the ratio of vapor to carrier gas in the vapor stream and applying heat to the liquid within the bubbler at rates relative to the sensed ratios of vapor to carrier gas being delivered from the bubbler in a vapor stream to hold the ratio constant.

A vapor delivery control system is also disclosed which comprises a vaporizer, a heater thermally coupled with the vaporizer, and means for maintaining a supply of liquid in the vaporizer. The system further includes means for introducing a carrier gas into the vaporizer, means for conducting the carrier gas and vapors of the liquid entrained with the carrier gas from the vaporizer, means for sensing the ratio of vapor to carrier gas being conducted from the vaporizer, and means for controlling the heater responsive to the ratio of vapor to carrier gas sensed by the sensing means to hold the ratio constant.

9 Claims, 2 Drawing Figures

VAPOR DELIVERY CONTROL SYSTEM AND METHOD

REFERENCE TO RELATED APPLICATION

This is a continuation Ser. No. 967,806 filed Dec. 8, 1978, now abandoned.

TECHNICAL FIELD

This invention relates to methods and systems for controlling the delivery of vapors.

BACKGROUND OF THE INVENTION

With the advent of optical waveguides for use in the communications industry much emphasis has recently been placed on vapor deposition as a materials forming technique. In constructing preforms from which optical fibers may be drawn, vapors of materials such as $SiCl_4$, $GeCl_4$ and $POCl_3$ must be precisely delivered at controlled mass flow rates to the preform construction site where they are reacted and deposited on or in a support. This can be done by passing carrier gases such as $H_2$, $He$, $N_2$, $O_2$, or $Ar$ through a supply of the material in liquid form to the deposition site as a mixture with the vapors entrained with the carrier gas. In preforming this operation a vaporizer is ordinarily use of the type known as a bubbler which has a carrier gas intake conduit that terminates with an outlet orifice located below the surface of the liquid materials and an outlet conduit extending from the space above the surface of the liquid within the bubbler to the deposition site.

To construct an optical waveguide preform properly the mass flow rate of the vapor must be carefully programmed and accurately controlled. Heretofore control has been achieved with vaporizer controllers such as the Source Vaporizer Controllers sold by the Tylan Corporation of Torrance, California. Controllers of this type employ a carrier gas mass flow rate sensor and a vapor to carrier gas ratio sensor.

The carrier gas flow rate sensor operates on the theory that the heat added to a known mass of gas is proportional to its temperature rise at relatively constant pressure. It employs two resistance heating elements which are part of a bridge circuit, positioned in series with each other on the outside of a sensor tube. Gas is passed through the tube which creates a bridge imbalance, the signal from which is proportional to the mass flow rate. The vapor to carrier gas ratio sensor also operates as a function of heat transfer. This sensor employs one electrical resistance element located in the carrier gas intake stream and another in the vapor and carrier gas stream, hereinafter termed "vapor stream". Again the sensors are elements of a bridge circuit which indicates an imbalance as soon as the properties of the gas and vapor stream differ. This difference is proportional to the ratio of source to carrier gas.

With these controllers the electrical signals from the carrier gas flow rate and vapor to carrier gas ratio bridge circuits are electronically multiplied and the product compared with a preselected set point for vapor mass flow rate. An error signal is then fed through an amplifier to an electrically controlled valve located in line with the carrier gas intake conduit. When an insufficient mass flow is detected the valve in the carrier gas intake conduit is opened further to increase the flow of carrier gas into the vaporizer which, in theory, serves to pick up more vapor and increase the mass flow rate. Conversely, if too great of mass flow rate is detected the valve is closed somewhat. A more detail description of such vaporizer controllers and their components may be had by reference to U.S. Pat. Nos. 3,938,384 and 3,939,858.

Though the just described system and method for controlling vapor delivery has been found to be the best available, it nevertheless is quite inaccurate with deviations from optimum set points ranging as great at 30% over both long and short terms. This is attributable at least in part to the fact that this method assumes a steady state condition of vapor pressure. In actuality however the system is not in a steady state since vapor pressure depends on numerous criteria such as carrier gas retention time within the liquid, the depth at which the bubbles are released within the liquid, total pressure, carrier gas temperature, localized temperature inhomogentities surrounding the bubbles as they travel toward the liquid surface, and heat flow into the bubbler from its environment. These effects all become more important as flow rates increase and the liquid levels in the bubbler decreases since retention by carrier gases also decreases as localized cooling takes place.

It is thus seen that control of the flow rate of carrier gas into a vaporizer is only a relatively crude method of controlling mass flow rate of vapor from the vaporizer because of the dynamics of such systems. Some investigators have sought to overcome this problem by placing an array of temperature sensors in the liquid housed within the bubbler and controlling heat into the bubbler responsive to sensed temperatures. This approach however has also failed to produce as high a degree of accuracy which again is belived to be attributable at least in part to the dynamics of the system.

SUMMARY OF THE INVENTION

In one form of the present invention a method is provided for controlling the delivery of vapor from a bubbler containing a supply of liquid through which a carrier gas is bubbled and from which bubbler vapors are delivered in a vapor stream entrained with the carrier gas. The method comprises the steps of sensing the ratio of vapor to carrier gas in the vapor stream and applying heat to the liquid within the bubbler at rates relative to the sensed ratios of vapor to carrier gas being delivered from the bubbler in the vapor stream to hold the ratio constant.

In another form of the invention a vapor delivery control system is provided which comprises a vaporizer, a heater thermally coupled with the vaporizer, and means for maintaining a supply of liquid in the vaporizer. The system also comprises means for introducing a carrier gas into the vaporizer, means for conducting the carrier gas and vapors of the liquid entrained with the carrier gas from the vaporizer, means for sensing the ratio of vapor to carrier gas being conducted from the vaporizer, and means for controlling the heater responsive to ratios of vapor to carrier gas sensed by the sensing means.

These and other features of the invention will become apparent from the following specifically described embodiment thereof.

DESCRIPTION OF THE PREFERRED EMBODIMENT

Figure 1:
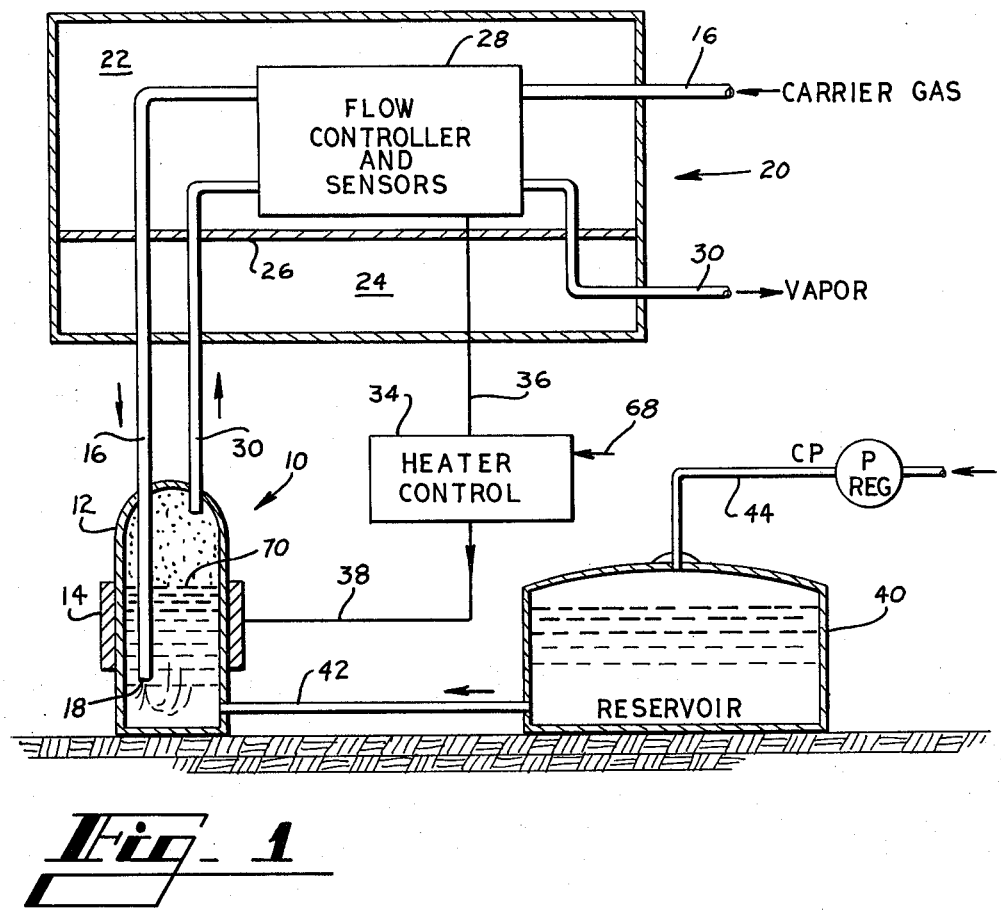
FIG. 1 is a schematic diagram of a vapor control delivery system embodying principles of the invention in one preferred form which may be used in practicing a method of the invention in a preferred form.

Referring now in more detail to the drawing, there is shown in FIG. 1 a vapor delivery control system comprising a vaporizer 10 in the form of a bubbler 12 having a resistance heater 14 jacketed about the exterior surface of the bubbler. A carrier gas intake conduit 16 extends from an unshown source of pressurized gas laterally into the upper space 22 of a temperature controlled enclosure 20 and through a flow controller and sensors unit 28. After passing from the unit 28 the conduit 16 is directed downwardly through a partition 26 and through a lower space 24 within the enclosure 20. The conduit then exits the enclosure and extends further downwardly into the bubbler 12 terminating with a lower outlet 18 located adjacent the bottom of the bubbler.

A vapor stream conduit 30 extends upwardly from an intake orifice 32 located within and adjacent the top of the bubbler 12 into the heat-controlled enclosure 20 through the flow controllers and sensor unit and into enclosure 24 where it junctures with other, unknown vapor stream conduits from other bubblers of the type shown and then out of the enclosure to a vapor deposition station. The flow controller and sensors unit is electrically coupled to a heater control 34 by control signal line 36. A load line 38 extends from the heater controller to the resistance heater 14 jacketed about the bubbler 12. A reservoir 40 is also provided together with conduit 42 in fluid communication between lower portions of the reservoir and bubbler. A gas intake line 44 extends upwardly from the top of the reservoir through a pressure regulator to a source of compressed gas. The pressure of the gas is adjusted to maintain constant reservoir head pressure.

Figure 2:
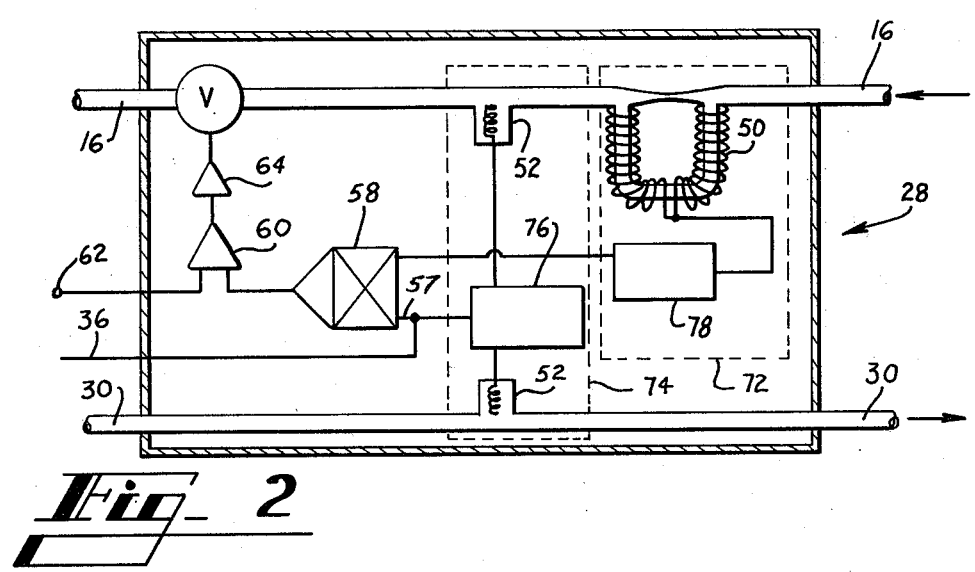
FIG. 2 is a schematic diagram of the flow controller and sensors unit of the system shown in FIG. 1.

With reference next to FIG. 2 the flow controller and sensors unit 28 is schematically seen to include both a flow rate sensor and a vapor to carrier gas ratio sensor. The flow rate sensor includes a pair of electric resistance elements 50 wound in series around a sensor tube in fluid communication with the carrier gas intake conduit 16. In conjunction with other elements 78 the resistance elements form a bridge circuit 72. The flow rate sensor utilizes the principle that the temperature rise of a gas at a relatively constant pressure is a function of the amount of heat added, the mass flow rate and other properties of the gas. Constant power is supplied to the sensor unit which in turn changes the relative resistances of the unit resistors when gas is flowed through the sensor tube. The upstream sensor is cooled at a higher rate than the downstream sensor producing a bridge unbalance. The bridge output can then be calibrated with actual gas flow that are monitored with a standard such as a Brooks volumeter.

The vapor to carrier gas ratio sensor unit also employs the just described principle by utilizing sensor elements 52 which are exposed to the flow of both the input carrier gas and to the vapor stream and whose resistance changes are functions of thermal properties of the two streams. Similarly, these elements 52 together with other elements 76 form a bridge circuit 74. Bridge output versus ratio curves are producable by mixing known mixtures and plotting calibration curves. The bridge output voltages curves, which are not completely linear and stable, thus provides respresentation of the vapor to carrier gas ratios.

The output signal from the vapor to carrier gas ratio sensor bridge circuit 74 is transmitted over line 36 to the signal input terminal of the heater control 34. The heater control itself here is a conventional power controller such as the 3-mode power controller sold by Reserarch, Inc. as Model No. 639B. The controller compares the input signal with a preselected vapor to carrier gas ratio set point 68 and in response thereto controls the current flow to the bubbler heater 14 over power line 38 which is connected to the power output terminal of the heater control.

The signal from bridge circuit 74 is fed by line 57 to a voltage multiplier 58. The signal from the carrier gas flow rate sensor bridge circuit 72 is also fed to the mutiplier. The output signal from the multiplier is in turn conducted to a voltage comparator 60 where the signal is compared with a pre-established voltage via a set point terminal 62. The output signal of the comparator is directed through an amplifier 64 to a valve V positioned within the carrier gas input conduit 16. Alternatively, the signal from circuit 74 may not be transmitted to the multiplier 58 and the signal from the circuit 72 merely transmitted directly to the comparator 60 thereby eliminating the multiplier from the circuitry and controlling carrier and ratio separately.

In operation, the reservoir 40 is partially filled with liquid chemicals which are to be deposited by vapor deposition at an unshown vapor deposition station such as where a fiber optics preform or rod is to be constructed. As shown in the drawing the reservoir may be mounted at the same height as the bubbler 12. As a result the liquid chemicals flow from the reservoir through conduit 42 into the bubbler until the surface level 70 of the liquid in the bubbler equals that of the surface level of the liquid within the reservoir. A gas is then introduced under pressure into the reservoir 40 through conduit 44 and the pressure set with the pressure regulator to establish a preselected level for the surface 70 of the liquid within the bubbler. The pressure is then maintained constant within the reservoir by the pressure regulator. As the reservoir contains a substantially larger supply of liquid than the bubbler, the rate at which the level of liquid 70 in the bubbler changes remains quite low. Periodically, however, significant lowering of level 70 occurs whereupon the level is adjusted by increasing the pressure head of reservoir 40. In deriving the selected level the effervescent condition of the liquid with carrier gas being bubbled up therethrough is taken into account. It is important to insure that the level 70 of the vaporizable liquid in the bubbler maintains constant as this system provides.

With a constant level of liquid in the bubbler the carrier gas, which may be oxygen for example, is introduced through the flow controller and through the vaporizer and bubbled up through the liquid. Since the liquid within the bubbler is maintained substantially constant the rise time and size of the bubbles is preestablished by the size of the outlet 18 of the conduit 16. In turn, both the surface area and time of exposure of the bubbles of carrier gas to the liquid as the gas rises to the surface 70 is also preselected. Vapors thus diffuse into the bubbles themselves as well as occupying the space above the surface 70 within the bubbler. Vaporization also occurs at the surface of the liquid. As a result it is not mandatory that the vaporizer 10 here be of the bubbler type. Finally, the carrier gas carries the vapors out of the bubbler through the inlet orifice conduit 30 and then upwardly through the conduit to the ratio sensor and an unshown manifold where it is mixed with gases and other vapors entering the enclosure from other unshown bubblers of the same type.

It should be noted that the orientation of the conduit 30 is vertical as it leaves the bubbler. This is done so that any condensation or aerosol which might occur with this portion of the conduit gravitates back into the bubbler. The conduit passes through the lower space 24 of the enclosure 20 and into the upper space 22 where it turns laterally and passes through the ratio sensors unit 28 to space 24 and then out of the enclosure. The temperature of the lower air space 24 is preferably maintained approximately 5° to 10° F. above that of the upper space 22. Due to this elevation in temperature over the ambient room temperature environment of the bubbler there is little tendency for condensation to form within the vapor steam as it approaches and after it has departed from the flow controller and sensors unit since it is constantly being heated.

The vapor stream now passes over a vapor to carrier gas ratio sensor 52 and then out of the delivery system through conduit 30 to the vapor deposition station. If the vapor deposition station is located at any significant distance from enclosure 20 that portion of conduit 16 between the station and enclosure should also be heated. As the stream passes over sensor 52 the sensor and associated circuitry detects the ratio of vapor to carrier gas being delivered to the vapor deposition station. A corresponding signal is transmitted from the sensor circuit 74 over line 36 to the heater control to hold it constant. At the heater control this input signal is compared with a set point established at terminal 68. If the sensed ratio is found to be too low the heater control increases the current delivered over line 38 to the resistance heater 14 mounted about the bubbler thereby causing a higher rate of heat to be inputted into the liquid chemicals housed within the bubbler. Conversely, if the ratio of the vapor to carrier gas is found to be too low the heater control decreases the flow of current to the heater. The quantitative relationship here may be expressed as:

$$P = K_p \cdot \text{error} + K_i \int_0^{t_1} \text{error}\, dt + K_r \frac{d_{\text{error}}}{dt}$$

where P is power, $K_p$ the proportionality constant, $K_i$ the integration constant, $K_r$ the rate constant, and t is time.

As the sensor circuit 74 and heater control 34 operate in controlling heater 14, the carrier gas flow rate sensor circuit 72 simultaneously controls the flow rate of the carrier gas being inputted to the bubbler. The signals from the ratio sensor circuit are combined with those of the flow rate sensor circuit at the voltage multiplier. This signal is compared to a control set point for vapor mass flow rate and small deviations are trimmed by automatically making slight adjustments to the carrier gas flow as a means for controlling mass flow rate. It is however emphasized that it is the heater circuit which holds the ratio constant. The expression which relates the vapor flow rate to ratio and carrier flow rate is as follows:

$$V = K \times R \times C$$

where,
V = mass flow rate of vapor
K = molecular weight of vapor
R = mole ratio of vapor to carrier
C = carrier flow rate to moles.

One example here is provided by 800 cc/min carrier gas intake, a 60% ratio, and 4 gms/min of chemical vapor.

We thus see that whereas before accurate control of vapor delivery over a range of values has not been achievable by solely controlling the flow rate of carrier gas, the present invention does provide a highly accurate control system and method of effecting such by sensing and controlling the ratio of vapor to carrier gas in conjunction with control of carrier gas flow. Indeed, vapor mass flow rate accuracy of ±2% of full scale has now been achieved over the flow range (5% to 100% of full scale). Thus, by directly controlling source to carrier gas ratios vapor mass delivery rates may be maintained in a highly accurate manner and changed from time to time by changing carrier gas flow rates with predictably accompanying delivery rate changes.

It should be understood that the just described embodiments merely illustrate principles of the invention in selected forms. Many modifications, deletions and additions may, of course, be made thereto without departure from the spirit and scope of the invention as set forth in the following claims.

What is claimed is:

1. A method of linearly controlling mass flow rates of delivery of vapor from a bubbler containing a supply of liquid through which a carrier gas is bubbled at preselected, mutually-diverse flow rates in which vapor pressure is not in steady state and from which bubbler vapor is delivered in a vapor stream entrained with the carrier gas, and with the method comprising the steps of sensing the ratio of vapor to carrier gas in the vapor stream and applying heat to the liquid within the bubbler at rates in direct relationship to the sensed ratios of vapor to carrier gas being delivered from the bubbler in the vapor stream to hold said ratio constant.

2. A vapor delivery control method in accordance with claim 1 wherein the ratio of vapor to carrier gas is detected by sensing the heat transfer characteristic of the vapor stream.

3. A vapor delivery control method in accordance with claim 1 or 2 wherein heat is applied to the liquid by thermal conduction into the bubbler.

4. A vapor delivery control method in accordance with claim 1 wherein the carrier gas flow rate is held constant at each of said preselected carrier gas flow rates.

5. A vapor delivery control system comprising a vaporizer; a heater thermally coupled with said vaporizer; means for maintaining a supply of liquid in said vaporizer; means for introducing a carrier gas into said vaporizer; means for conducting the carrier gas and vapors of the liquid entrained with the carrier gas from said vaporizer; means for sensing the ratio of vapor to carrier gas being conducted from said vaporizer; and means for controlling said heater directly responsive to ratios of vapor to carrier gas sensed by said sensing means, said controlling means including means for applying heat to the liquid in the vaporizer at rates in direct relationship to said sensed ratios to hold said ratio constant.

6. A vapor delivery control system in accordance with claim 5 wherein said means for maintaining a supply of liquid in said vaporizer includes means for maintaining the surface of the liquid at a generally constant level within said vaporizer.

7. A vapor delivery control system in accordance with claim 6 wherein said means for introducing a carrier gas into said vaporizer includes a conduit having an outlet positioned within said vaporizer below said liquid surface level.

8. A vapor delivery control system in accordance with claim 5 wherein said means for sensing the ratio of vapor to carrier gas includes means for sensing the heat transfer characteristic of the combined carrier gas and vapors being conducted from said vaporizer.

9. A vapor delivery control system in accordance with claim 5 or 8 further comprising means for adjusting the flow rate of carrier gas introduced into said vaporizer coupled with said means for sensing the ratio of vapor to carrier gas.

* * * * *

UNITED STATES PATENT AND TRADEMARK OFFICE
CERTIFICATE OF CORRECTION

PATENT NO. : 4,276,243
DATED : June 30, 1981
INVENTOR(S) : Fred P. Partus

It is certified that error appears in the above-identified patent and that said Letters Patent are hereby corrected as shown below:

Face Sheet, item [75] change "Cobbs County" to read ---Cobb County---

Col. 1, line 6 after "continuation" insert ---of application---

Col. 1, line 26 change "use" to read ---used---

Col. 5, line 46 change "$K_i \quad {}^{t_1}_{\phantom{t}o}$" to read ---$K_i \int_o^{t_1}$---

Col. 5, line 67 change "V=KxRxC" to read ---$\dot{V}=KxRx\dot{C}$---

Col. 6, line 2 change "V" to read ---$\dot{V}$---

Col. 6, line 5 change "C" to read ---$\dot{C}$---.

*Signed and Sealed this*

*Fifteenth* Day of *September 1981*

[SEAL]

*Attest:*

GERALD J. MOSSINGHOFF

*Attesting Officer*   *Commissioner of Patents and Trademarks*